United States Patent …

(12) United States Patent
Franceschini et al.

(10) Patent No.: US 9,058,896 B2
(45) Date of Patent: Jun. 16, 2015

(54) DRAM REFRESH

(75) Inventors: Michele M. Franceschini, White Plains, NY (US); Hillery Hunter, Deerfield, IL (US); Ashish Jagmohan, Irvington, NY (US); Charles A. Kilmer, Essex Junction, VT (US); Kyu-Hyoun Kim, Mount Kisco, NY (US); Luis A. Lastras, Cortlandt Manor, NY (US); Moinuddin K. Qureshi, Atlanta, GA (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 13/598,001

(22) Filed: Aug. 29, 2012

(65) Prior Publication Data
US 2014/0063997 A1 Mar. 6, 2014

(51) Int. Cl.
G11C 7/00 (2006.01)
G11C 11/406 (2006.01)
G11C 29/50 (2006.01)

(52) U.S. Cl.
CPC .. *G11C 11/40622* (2013.01); *G11C 2211/4065* (2013.01); *G11C 2211/4068* (2013.01); *G11C 29/50016* (2013.01)

(58) Field of Classification Search
CPC ........... G11C 11/40622; G11C 11/401; G11C 11/402; G11C 2211/406–2211/4067; G11C 29/50016
USPC .................................................. 365/222, 201
See application file for complete search history.

(56) References Cited

U.S. PATENT DOCUMENTS

| 4,044,344 | A | * | 8/1977 | Wada et al. .................... 365/201 |
| 4,736,344 | A | | 4/1988 | Yanagisawa |
| 4,987,559 | A | * | 1/1991 | Miyauchi et al. ........ 365/189.04 |
| 6,167,484 | A | * | 12/2000 | Boyer et al. ................... 711/106 |
| 6,483,764 | B2 | | 11/2002 | Chen Hsu et al. |
| 6,728,156 | B2 | | 4/2004 | Kilmer et al. |
| 6,920,523 | B2 | | 7/2005 | Le et al. |
| 7,095,669 | B2 | * | 8/2006 | Oh ............................... 365/222 |
| 7,206,244 | B2 | | 4/2007 | Cruz et al. |
| 7,233,538 | B1 | | 6/2007 | Wu et al. |
| 7,305,518 | B2 | | 12/2007 | Zeighami et al. |
| 7,444,577 | B2 | | 10/2008 | Best et al. |
| 7,515,494 | B2 | | 4/2009 | Butler |
| 7,565,479 | B2 | | 7/2009 | Best et al. |
| 7,734,866 | B2 | | 6/2010 | Tsern |
| 2003/0065884 | A1 | * | 4/2003 | Lu et al. ........................ 711/118 |

(Continued)

OTHER PUBLICATIONS

Borden et al., "On Coding for 'Stuck-at' Defects (Corresp).", IEEE Transactions on Information Theory, vol. 33, Issue 5, 1983. pp. 729-735. DOI: 10.1109/TIT.1987.1057347.

(Continued)

*Primary Examiner* — Vanthu Nguyen
*Assistant Examiner* — Khamdan Alrobaie
(74) *Attorney, Agent, or Firm* — Nicholas D. Bowman; Robert Williams

(57) ABSTRACT

A refresh of a DRAM having at least a fast and a slow refresh rate includes encoding a pointer on a row or rows with refresh information, reading the refresh information, and incrementing a fast refresh address counter with the refresh information. The refresh may be performed by encoding one or more cells on a row that may require a fast refresh, one or more cells on a group of rows that may require a fast refresh, or one or more cells on a row that may not require a fast refresh.

17 Claims, 6 Drawing Sheets

(56) References Cited

U.S. PATENT DOCUMENTS

2004/0196718 A1* 10/2004 Poechmueller ............... 365/222
2007/0106838 A1* 5/2007 Choi ............................. 711/106
2008/0313494 A1* 12/2008 Hummler et al. ................ 714/6
2013/0016574 A1* 1/2013 Kim et al. ................ 365/189.07

OTHER PUBLICATIONS

Heegard et al., "On the Capacity of Computer Memory with Defects", IEEE Transactions on Information Theory, vol. 29, Issue 5, 1983. pp. 731-739. DOI: 10.1109/TIT.1983.1056723.

Heegard, "Partitioned Linear Block Codes for Computer Memory with 'Stuck-at' Defects", IEEE Transactions on Information Theory. vol. 29, No. 6, Nov. 1983. pp. 831-842. DOI: 10.1109/TIT.1983.1056763.

Idei, Y. et al, "Dual-Period Self-Refresh Scheme for Low-Power DRAM's with On-Chip PROM Mode Register", IEEE Journal of Solid-State Circuits, Feb. 1998, pp. 253-259, vol. 33, No. 2. DOI: 10.1109/4.658627.

Kim, J., & Papaefthymiou, M., "Dynamic Memory Design for Low Data-Retention Power", Proceedings of the 10th International Workshop on Integrated Circuit Design, Power and Timing Modeling, Optimization and Simulation, PATMOS '00, in Lecture Notes in Computer Science, vol. 1918/2000 Springer-Verlag, 2000, pp. 207-216.

Kim, J., & Papaefthymiou, M., "Block-Based Multi-Period Refresh for Energy Efficient Dynamic Memory", 14th Annual IEEE International ASIC/SOC Conference 2001, Sep. 12-15, 2001. IEEE Issue 7 Aug. 2002. pp. 193-197. DOI: 10.1109/ASIC.2001.954696.

Kim, J., & Papaefthymiou, M., "Block-Based Multi-Period Dynamic Memory Design for Low Data-Retention Power", IEEE Transactions on Very Large Scale Integration (VLSI) Systems, Dec. 2003, pp. 1006-1018, vol. 11, No. 6. DOI: 10.1109/TVSLI.2003.817524.

Krishnamoorthy et al., "Error Control to Increase the Yield of Semiconductor RAM's", The 1998 IEEE/CAM Information Theory Workshop at Cornell, 1989. DOI: 10.1109/ITW.1989.761432.

Ohsawa et al., "Optimizing the DRAM Refresh Count for Merged DRAM/Logic LSIs", International Proceedings on Low Power Electronics and Design, 1998. pp. 82-87.

Venkatesan et al., "Retention-Aware Placement in DRAM (RAPID): Software Methods for Quasi-Non-Volatile DRAM", The 12th International Symposium on High Performance Computer Architecture, 2006. pp. 157-167. DOI: 10.1109/HPCA.2006.1598122.

U.S. Appl. No. 12/433,157, filed Apr. 30, 2009, "Increased Capacity Heterogeneous Storage Elements", Elfadel et al.

U.S. Appl. No. 12/553,400, filed Sep. 3, 2009, "Advanced Memory Device Having Improved Performance, Reduced Power and Increased Reliability", Chiu et al.

U.S. Appl. No. 12/814,142, filed Jun. 11, 2010, "Encoding Data Into Constrained Memory", Franceschini et al.

U.S. Appl. No. 12/963,797, filed Dec. 9, 2010, "Memory System With a Programmable Refresh Cycle", Kilmer et al.

U.S. Appl. No. 13/569,486, filed Aug. 8, 2012, "Method for Optimizing Refresh Rate for DRAM", Franceschini et al.

\* cited by examiner

DRAM REFRESH

This disclosure relates to DRAM refresh. In particular, it relates to encoding rows of cells for a fast refresh rate in a multiple refresh rate refresh system.

BACKGROUND

A dynamic memory cell stores a charge on a capacitor. The capacitor loses its charge over time and must be periodically refreshed. This refresh operation consumes resources and locks up the memory from performing other operations during the refresh, such as reading and writing. The frequency with which a particular capacitor will need refreshing depends on the construction and manufacture of the chip. On the same chip and often the same row, some capacitors may hold a charge on the order of milliseconds, while other capacitors may hold a charge on the order of seconds.

SUMMARY

In an embodiment, this disclosure includes a DRAM having a fast refresh rate and a slow refresh rate, including a fast refresh address counter, rows of two or more cells, and one or more cells in one or more rows dedicated to storing refresh information. The refresh information communicates to the fast refresh address counter the row address of the next row to be refreshed.

In another embodiment, this disclosure includes a method for performing a memory refresh having at least a fast and a slow refresh rate, including encoding a row of cells with refresh information, reading the refresh information, and incrementing a fast refresh address counter with the refresh information.

In another embodiment, this disclosure includes a method for performing a memory refresh having at least a fast and a slow refresh rate, including encoding a row of cells with refresh information using an encoding circuit, reading the refresh information using a refresh controller, and incrementing a fast refresh address counter with the refresh information using the refresh controller.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of typical embodiments of the invention and do not limit the invention.

DETAILED DESCRIPTION

Dynamic random access memory (DRAM) must be periodically refreshed, as the capacitors that store a charge in the DRAM may leak the charge over time. However, these capacitors do not all lose charge at the same rate or require refreshing at the same frequency. Due to manufacturing variations, some DRAM cells may leak or pick up charge at different rates than other cells. Rows having cells with capacitors poor at holding a charge must be refreshed at a faster rate than the majority of rows, which may have cells that are strong at holding a charge.

Traditionally, each row of the DRAM was refreshed at the refresh rate required for the weakest cells; this ensured that all the DRAM cells were refreshed before losing their charge. Refreshing DRAM consumes power and resources, and minimizing the total refresh time for the DRAM may reduce the power consumption of the DRAM and free up time and resources for reading and writing operations.

According to the principles of the invention, time spent on refresh may be optimized through a system of multiple refresh rates, including a fast refresh rate suitable to retain data on the weakest cells in a particular DRAM technology and a slow refresh rate for rows with cells that are able to retain their charge over a larger refresh interval. The fast refresh rate may be the rate at which the weakest cells in a row require refreshing. The slow refresh rate may be a calculated or adjustable refresh rate. Any row of cells that may not be adequately refreshed at the slow refresh rate may be refreshed at the fast refresh rate. For the refresh controller to refresh rows at different refresh rates, it must know which rows to refresh at the fast and slow refresh rates.

Figure 1:
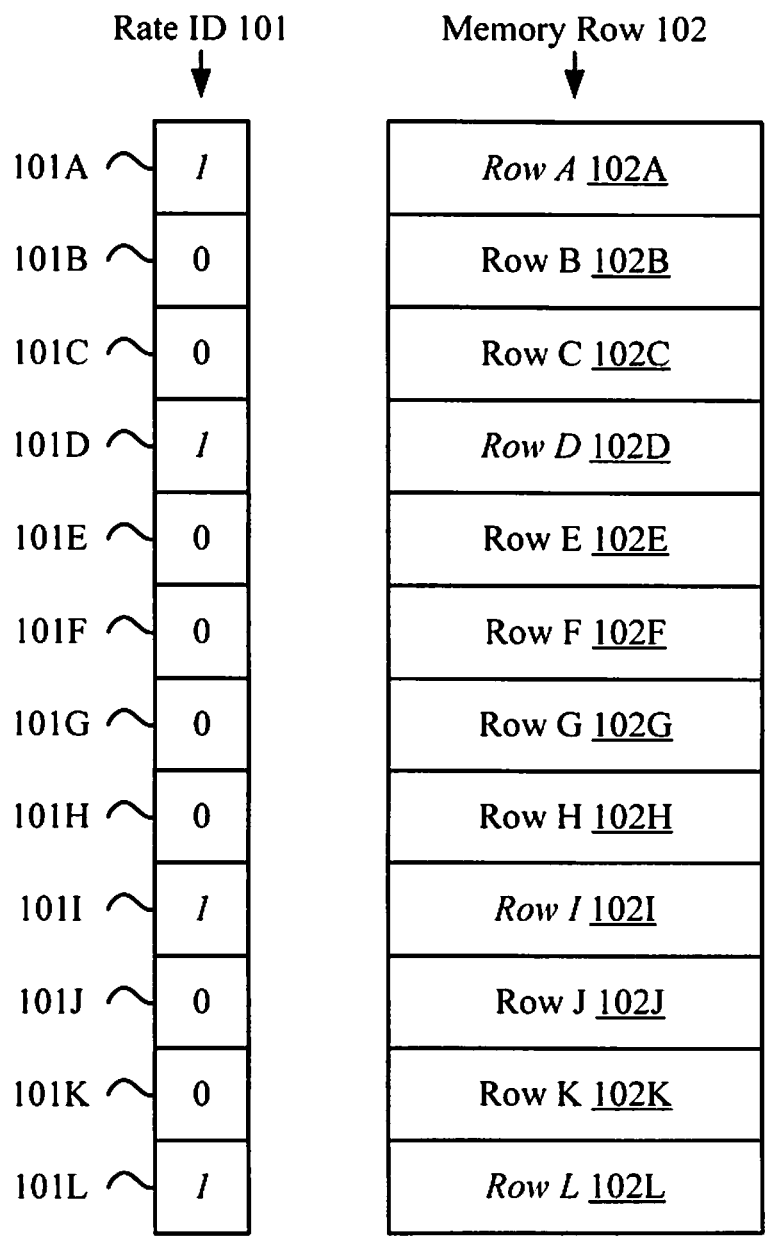
FIG. 1 is a diagrammatic representation of DRAM rows having a rate ID, according to embodiments of the invention.

FIG. 1 is a diagrammatic representation of DRAM rows having a refresh rate ID 101. This refresh rate ID 101 identifies the row as requiring either a fast or slow refresh. In this example, Row A 102A, Row D 102D, Row I 102I, and Row L 102L require a fast refresh. This is reflected by a "1" in the rate ID 101 for Row A 101A, Row D 101D, Row I 101I, and Row L 101L.

Ordinarily, refresh is performed by refreshing each row in a DRAM. A refresh address counter tracks the row address of the next row to be refreshed. As a row is refreshed, the refresh address counter is incremented by one. The refresh signal will refresh the row at the incremented row address, ensuring all rows are refreshed. The refresh address counter may be linked to read and write address counters, so that rows that have been read or written to do not have to be refreshed again. However, if multiple refresh rates are applied to the rows of a DRAM, a single refresh address counter may not be adequate to ensure rows are refreshed for their refresh cycles.

Method Structure

According to embodiments of the invention, a DRAM's refresh circuit may have at least a slow and a fast refresh address counter. The slow refresh address counter acts as an ordinary refresh address counter that increments by one for every row refresh cycle and sequences through all the row addresses. The fast refresh address counter associates with the fast refresh rate for rows that must be refreshed at the fast refresh rate, or "fast rows".

In a row or group of rows, one or more bits may be dedicated to storing refresh information at a preselected location in the rows. One or more rows or groups of rows that require a fast refresh may be encoded with refresh information regarding the address of the next row or group of rows that requires a fast refresh, referred to herein as a "pointer". Alternatively, one or more rows may be dedicated to storing the pointer information. Instead of incrementing by one every refresh cycle, the fast refresh address counter reads the refresh information from the pointer and increments itself by the refresh information. Thus, the fast refresh address counter enables the refresh controller to quickly refresh only those rows or groups of rows that require refreshing. This operation may be performed using localized information present on the DRAM and without the need to access an external registry for address information.

Figure 2:
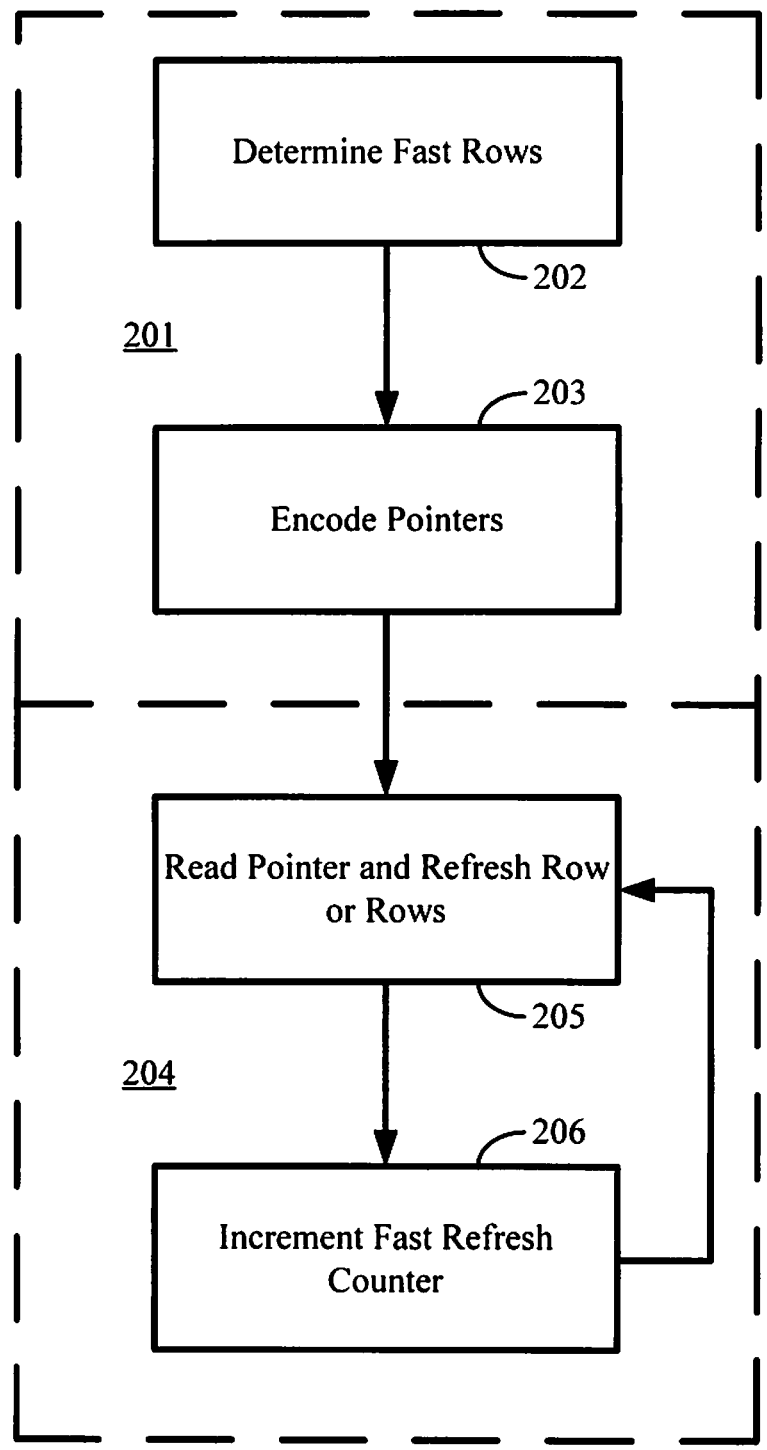
FIG. 2 is a flowchart of a method for implementing a DRAM encode and fast refresh, according to embodiments of the invention.

FIG. 2 is a flowchart of a method for implementing DRAM decode and fast refresh, according to embodiments of the invention. The method includes both an encoding stage 201 and a refresh stage 204. The encoding stage 201 may involve determining fast rows 202 requiring a fast refresh rate and encoding pointers 203 having information relating to the location of fast rows requiring a fast refresh rate. Determining fast rows may involve testing rows of cells for their ability to retain a value at a slow refresh rate and evaluating whether the rows retain the value. Encoding pointers may involve writing refresh information regarding fast rows to rows or segments.

Once the pointers are encoded, the DRAM may be refreshed at a fast refresh rate. The refresh stage 204 may involve reading the pointer information and refreshing the fast rows 205 and incrementing the fast refresh counter 206 by the refresh information stored as the pointer.

Multiple Bits Per Row

In an embodiment of the invention, each row may have a number of bits dedicated as a fast refresh pointer for the fast refresh address counter. The pointer may form a word that increments a fast refresh address counter to refresh at the next row requiring a fast refresh. The number of bits dedicated to this storage may change. For example, if it is found that the DRAM has many rows requiring a fast refresh rate, then the distance between rows may be smaller, and fewer bits may be required. In one embodiment, the optimal number of bits for a given fraction of weak rows may be represented by the following equation:

$$K=\log_2(0.7)-\log_2(F_f)$$

where K is the number of bits and $F_f$ is the fraction of cells requiring a fast refresh rate.

Figure 3:
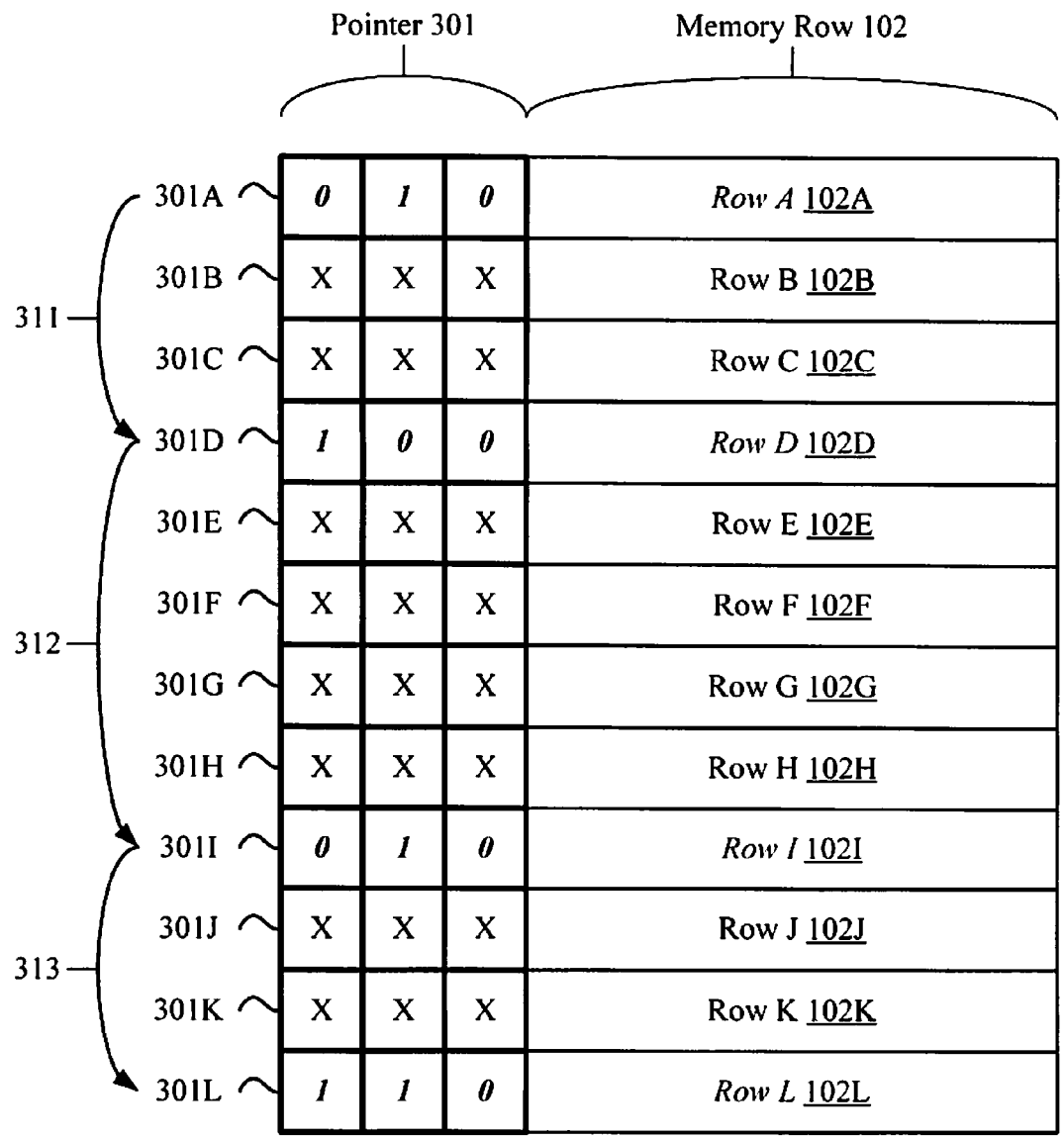
FIG. 3 is a diagrammatic representation of using multiple bits per row as a fast refresh pointer, according to an embodiment of the invention.

FIG. 3 is a diagrammatic representation of using multiple bits per row as a fast refresh pointer, according to an embodiment of the invention. Each memory row 102 has a corresponding pointer 301 of a number of bits, in this example three. The pointer 301 may be encoded during the encoding stage to point to another row. For example, suppose that in FIG. 3 the DRAM has been tested and Row A 102A, Row D 102D, Row I 102I, and Row L 102L are found to require a fast refresh rate. The pointers on these rows may be encoded to increment the fast refresh address counter, pointing it to the next "fast row" by specifying the number of rows to skip. During the encoding stage, the pointer of row A may be encoded with a "two" to point the fast refresh address counter to Row D 102D, which is the next row requiring a fast refresh. When the fast refresh address counter comes to row A, it refreshes the row, reads the pointer 301A (two), and adds the increment to its regular refresh counting (two plus one). The fast refresh address counter would skip over Row B 102B and Row C 102C and refresh Row D 102D, as in the first interval 311. The fast refresh address counter may read the Row D pointer 301D before or after the row refresh.

The dedicated bits in rows that do not require a fast refresh do not need to be encoded as pointers. However, it may be desirable to encode these bits as pointers. For example, the gap between rows requiring a fast refresh may be larger than the largest word capable of being stored on the dedicated bits. In this situation, the dedicated bits of a slow row may be encoded as a pointer to increment the fast refresh address counter and skip a number of rows. As another example, it may be desirable to encode pointers for several slow rows in the event that the fast refresh address counter does not properly read a pointer. This would move the fast refresh address counter along without requiring it to refresh all rows until the next fast row containing a pointer.

Segmented Rows/One or More Bits Per Row

In an embodiment of the invention, two or more rows of a DRAM are grouped into segments for a refresh operation, with one or more bits per row dedicated to storing refresh information as part of a pointer. The rows of the DRAM may be grouped into segments and the dedicated bits in the rows of the segment may be encoded to form a pointer. Each row may dedicate one or more bits as pointer bits for constituting part of the pointer, such as one bit at the beginning of a row. The pointer bits from the rows in a segment may be read and combined to form a word. This word may be used as a pointer for the fast refresh address counter. The rows contained in the segment may be refreshed as a segment.

Figure 4:
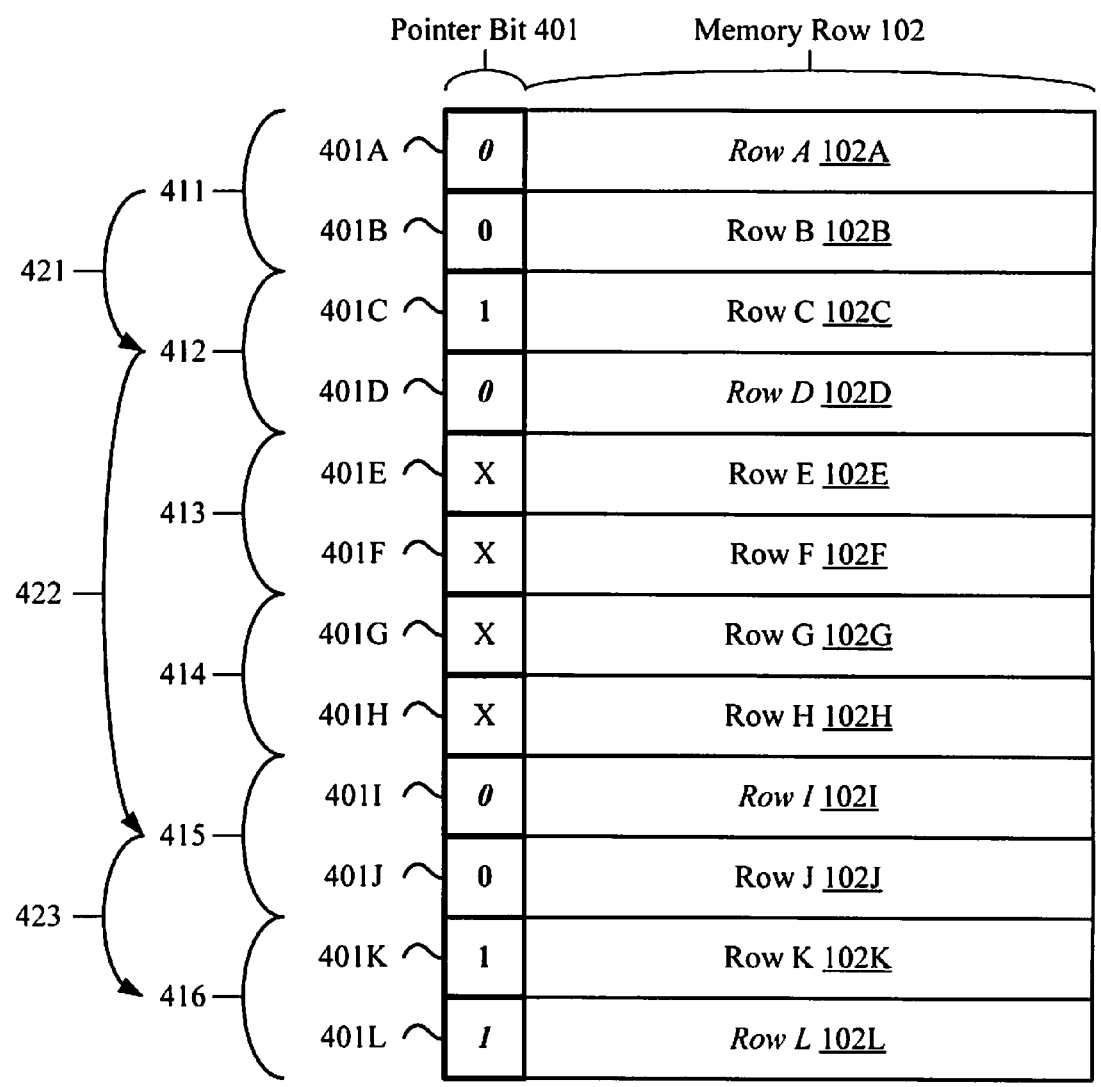
FIG. 4 is a diagrammatic representation of using segments of multiple rows, each with one bit per row, as a fast refresh pointer, according to an embodiment of the invention.

FIG. 4 is a diagrammatic representation of using segments (411, 412, 413, 414, 415, and 416) of two rows, each with one bit per row, as part of a fast refresh pointer, according to an embodiment of the invention. In FIG. 4, each memory row 102 has one pointer bit 401 dedicated to storing part of the information used as a pointer. Suppose that the DRAM has been tested and Row A 102A, Row D 102D, Row I 102I, and Row L 102L are found to require a fast refresh. The first bits of multiple rows may form a word, as seen in FIG. 4 as a vertical sequence. For example, for the second segment 412 containing Row C 102C and Row D 102D, the Row C bit 401C is a "one" and the Row D bit 401D is a "zero." These two bits form a two bit word "two." When the second segment 412 is to be refreshed, the refresh controller refreshes Row C 102C and Row D 102D, reads the pointer created by Row C bit 401C and Row D bit 401D (two), and increments the fast refresh address counter by the pointer (two plus one). The fast refresh address counter skips the third segment 413 and the fourth segment 414 and refreshes Row I 102I and Row J 102J in the fifth segment 415, as in the second interval 422. The fast refresh address counter reads the pointer formed by the Row I bit 401I and Row J bit 401J.

The number of rows in a segment may depend on the fraction of cells requiring a fast refresh in a DRAM. As the number of rows in a segment increases, the number of bits in a pointer increases, which allows the fast refresh address counter to skip a greater number of rows between fast rows requiring fast refreshes. However, all the rows in the segment may be refreshed at the same refresh rate, which may lead to rows which do not require a fast refresh rate being refreshed at the fast refresh rate. While pointer bits in the examples shown in FIGS. 1 and 3 are depicted in the left most positions of rows, pointer bits may be provided at any desired position in the rows. Further, pointer bits may be provided at different positions in different rows in one embodiment.

Dedicated Row

In another embodiment, one or more rows of a DRAM are dedicated to storing refresh information as pointers for rows that require a fast refresh, referred to herein as a "pointer row." A pointer row contains pointer information corresponding to intervals between fast rows. A number of bits in the pointer row are read to form a word for use as a fast refresh pointer and the fast refresh address counter is incremented by the pointer. The row may have one pointer for each row that requires a fast refresh. There may be more than one pointer row, and a pointer row may be any row. In operation, the memory row corresponding to the fast refresh address counter is refreshed, and the next pointer may be read from the pointer row. Alternatively, a number of pointers may be read at the same time and the pointers stored in a register. The memory rows may be refreshed sequentially until the fast refresh address counter has been incremented by all the pointers in the pointer row or rows.

Figure 5:
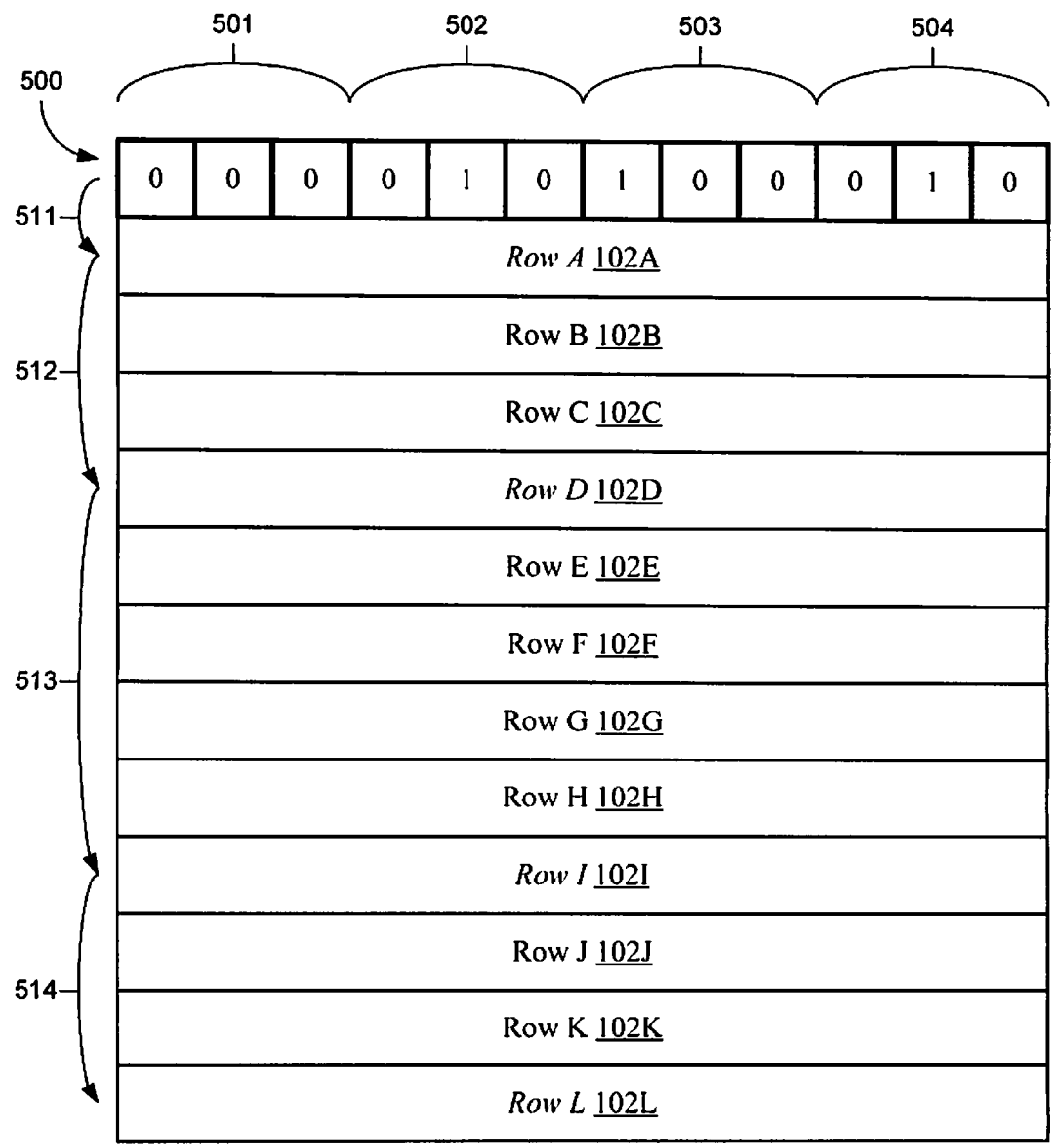
FIG. 5 is a diagrammatic representation of storing fast refresh pointer information on a dedicated row, according to an embodiment of the invention.

FIG. 5 is a diagrammatic representation of using dedicated pointer rows to store fast refresh pointer information, according to an embodiment of the invention. Suppose that in FIG. 5 the segment of DRAM has been tested and Row A 102A, Row D 102D, Row I 102I, and Row L 102L are found to require a fast refresh. The pointer row 500 may be encoded to increment the fast refresh address counter for the interval between the fast rows, pointing the fast refresh address counter to the next fast row. For example, during the encoding stage the three bits of the second pointer 502 may be encoded with a "two". When the fast refresh address counter reads the second pointer 502, it increments its counter by three (2+1), skips from Row A 102A to Row D 102D by the second interval 512, and refreshes Row D 102D. After refreshing Row D 102D, the fast refresh address counter reads the third pointer 503 (four), and continues the refresh sequence for the third interval 513.

Hardware Implementation

Figure 6:
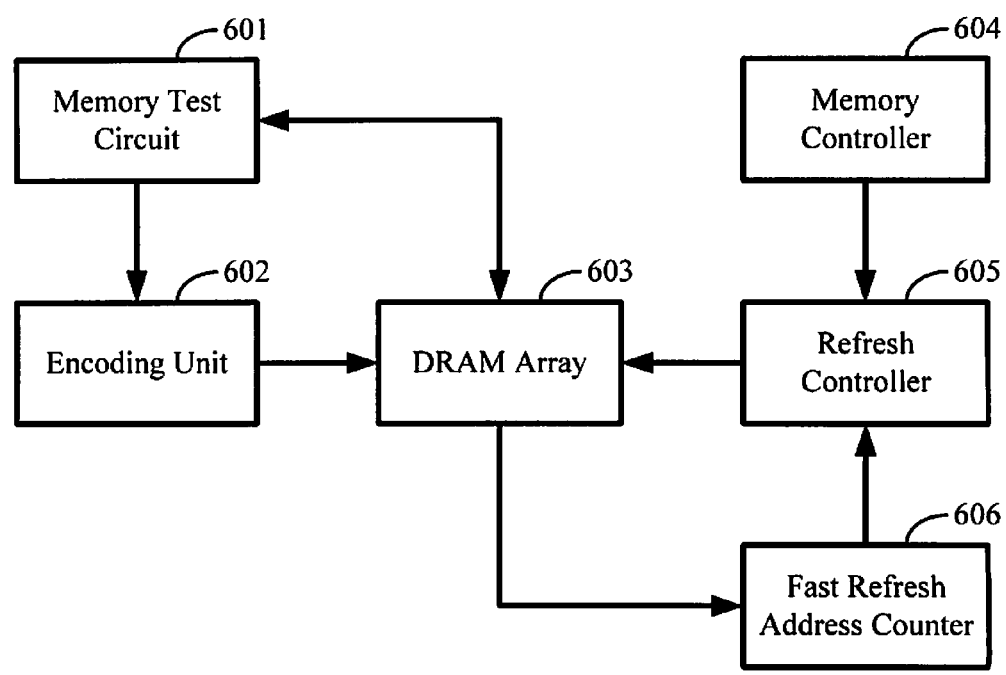
FIG. 6 is a diagrammatic representation of a hardware context for implementing refresh using fast refresh pointers, according to embodiments of the invention.

FIG. 6 is a diagrammatic representation of a hardware context for implementing fast refresh pointers, according to embodiments of the invention. A memory test circuit 601 may test a DRAM array 603 for fast rows. This test may involve writing a value to a row and reading the row after a period of time representative of a refresh interval. Address location regarding fast rows may be sent to an encoding unit 602, which may encode rows of the DRAM with pointers containing refresh information. During refresh operations, a memory controller 604 may send a signal to a refresh controller 605. The refresh controller 605 refreshes a row in the DRAM array 603. A fast refresh address counter 606 may read a pointer on a row and increment to the next row to be refreshed according to the pointer. The refresh controller may refresh a new row address corresponding to the fast refresh address counter 606.

In another embodiment, a method for performing a fast refresh may be implemented with discrete hardware or firmware components. The fast refresh method discussed above may be achieved through logic circuits or programmable devices, such as programmable logic arrays (PLA) or application specific integrated circuits (ASIC). The firmware may be present on-board a DRAM or off-board. The functions of the refresh rate optimization method may be performed through a combination of hardware and firmware.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. A DRAM having a fast refresh rate and a slow refresh rate, comprising:
   a fast refresh address counter;
   rows of two or more cells; and
   one or more cells in one or more of the rows used to store refresh information, wherein the fast refresh address counter uses the refresh information to determine the addresses of rows to be refreshed at the fast refresh rate;
   wherein the refresh information is a value corresponding to the next row to be refreshed.

2. The DRAM of claim 1, further comprising a memory test circuit for testing the rows for their ability to hold a charge.

3. The DRAM of claim 1, further comprising an encoding unit to encode the refresh information.

4. The DRAM of claim 1, wherein the cells used to store refresh information are at a preselected location in the rows.

5. The DRAM of claim 1, wherein two or more of the rows are grouped into a segment.

6. The DRAM of claim 1, wherein one or more rows are dedicated to storing refresh information.

7. A method for refreshing a memory having at least a fast and a slow refresh rate, Comprising:
   encoding a memory row with refresh information;
   reading the refresh information;
   incrementing a fast refresh address counter with the refresh information;
   wherein the refresh information is a value corresponding to the next memory row to be refreshed; and
   refreshing at a the fast refresh rate the next memory row corresponding to the results of the fast refresh address counter.

8. The method of claim 7, further comprising:
   testing rows for their ability to hold a charge for a refresh period; and
   determining whether the rows must be refreshed at the fast refresh rate.

9. The method of claim 7, wherein encoding a row with refresh information comprises writing a value to cells at a pre-specified location in the row and reading the refresh information comprises reading the cells.

10. The method of claim 7, further comprising grouping multiple rows encoded together into a segment.

11. The method of claim 10, further comprising refreshing the rows in a segment at the fast refresh rate.

12. The method of claim 10, wherein the refresh information is part of a value corresponding to the next row to be refreshed.

13. The method of claim 10, wherein encoding a row with refresh information comprises encoding a value to at least one cell on the row which forms part of a word in the segment.

14. The method of claim 13, wherein:
   reading the refresh information comprises reading values from the rows in the segment and forming the values of the cells from the rows in the segment into a word; and
   incrementing a fast refresh address counter with refresh information comprises incrementing a fast refresh address counter responsive to the word.

15. The method of claim 7, wherein encoding a row comprises writing the refresh information sequentially on the row and reading the refresh information comprises reading the refresh information relating to a next segment of rows requiring the fast refresh rate.

16. A method for performing a memory refresh having at least a fast and a slow refresh rate, comprising:
   encoding a row of cells with refresh information using an encoding unit;
   reading the refresh information using a refresh controller;
   incrementing a fast refresh address counter with the refresh information;
   wherein the refresh information is a value corresponding to the next row of cells to be refreshed; and
   refreshing at the fast refresh rate the next row of cells corresponding to the results of the fast refresh address counter.

17. The method of claim 16, further comprising testing rows for their ability to hold a charge for the refresh period and determining whether the rows must be refreshed at the fast refresh rate using a memory test circuit.

* * * * *